United States Patent [19]
Stephens, Jr. et al.

[11] Patent Number: 5,559,752
[45] Date of Patent: Sep. 24, 1996

[54] TIMING CONTROL CIRCUIT FOR SYNCHRONOUS STATIC RANDOM ACCESS MEMORY

[75] Inventors: Michael C. Stephens, Jr., San Jose; Chitranjan N. Reddy, Los Altos Hills; Kenneth A. Poteet, San Jose, all of Calif.

[73] Assignee: Alliance Semiconductor Corporation, San Jose, Calif.

[21] Appl. No.: 514,693

[22] Filed: Aug. 14, 1995

[51] Int. Cl.$^6$ ................................................ G11C 8/00
[52] U.S. Cl. ........................ 365/233; 365/191; 365/194
[58] Field of Search ................................. 365/233, 202, 365/191, 194, 205

[56] References Cited

U.S. PATENT DOCUMENTS

| | | | |
|---|---|---|---|
| 5,091,889 | 2/1992 | Hamano | 365/233 |
| 5,291,447 | 3/1994 | Kodama | 365/205 |
| 5,473,565 | 12/1995 | Kusakari | 365/233 |
| 5,479,374 | 12/1995 | Kobayashi | 365/202 |

*Primary Examiner*—David C. Nelms
*Assistant Examiner*—Son Mai
*Attorney, Agent, or Firm*—Bradley T. Sako

[57] ABSTRACT

A timing control circuit (10) is disclosed that provides a timing circuit (12) for controlling the operation of an I/O path circuit (14) in a synchronous static random access memory (SRAM). In a read or write operation, the timing circuit (12) sequentially disables bit line equalization circuits (34), enables sense amplifiers (38), disables I/O line equalization circuits (42), and enables secondary sense amplifiers (44). Further, the timing control (12) initiates a reset operation prior to the completion of the read or write operation. The reset operation includes sequentially enabling the bit line equalization circuits (34), disabling the sense amplifiers (38), enabling the I/O line equalization circuits (42), and disabling the secondary sense amplifiers (44). The timing circuit (12) includes first, second and third delay circuits (20, 22, and 24) to allow for minimum split times for bit line pairs (32) and I/O line pairs (40), and minimum secondary sense amplifier (44) sensing times.

20 Claims, 2 Drawing Sheets

TIMING CONTROL CIRCUIT FOR SYNCHRONOUS STATIC RANDOM ACCESS MEMORY

TECHNICAL FIELD

The present invention relates generally to random access memories, and more particularly to timing circuits and methods for synchronous static random access memories (SRAMs).

BACKGROUND OF THE INVENTION

Reading data from a random access memory (RAM) typically involves accessing a row of memory cells by driving a word line. The word line couples each cell in the row to a pair of bit lines. According to the binary value of the bit stored in each cell, the cell generates a voltage differential across its respective bit line pair. Sense amplifiers coupled to the bit lines amplify the voltage differentials and provide them as outputs on input/output (I/O) lines. The voltages on the I/O lines are further amplified by secondary sense amplifiers, and the resulting signal is latched in an I/O buffer. During a write operation to the RAM, a word line is driven, and a write amplifier drives the I/O lines and selected bit lines to store data in the cells accessed by the driven word line.

In order to increase the speed at which a read or write operation takes place, it is common to precharge and equalize the bit lines and I/O lines prior to a read or write operation. The precharge voltage is typically a voltage intermediate a logic high and logic low of the circuit. This enables the generally capacitive loads of I/O and/or bit lines to charge to a logic high or discharge to a logic low faster than would be possible if the lines had been at one logic level or the other. In addition to being precharged, bit lines and I/O lines are often shorted together, or "equalized" to the precharge voltage. To accomplish the precharge/equalization functions, bit line equalization circuits and I/O equalization circuits are commonly provided. As a result, the critical speed parameters of a memory (the memory cycle) will depend upon the time required for the memory to perform either a read or a write operation (hereinafter referred to as read/write operation) followed by an equalization of the bit lines and I/O lines. Prior art timing schemes initiate an equalization sequence after the read/write sequence by detecting a logic transition at the output of an I/O latch.

Commonly owned, co-pending U.S. patent application Ser. No. 423,822 entitled SYNCHRONOUS STATIC RANDOM ACCESS MEMORY HAVING ASYNCHRONOUS TEST MODE, incorporated by reference herein, sets forth a self-timed static RAM (SRAM) having a synchronous mode of operation in which a read/write timing sequence is followed by an equalization sequence.

Because increasing the operating speed capability of memory devices is a common goal of memory designs, it would be desirable to provide a timing control circuit for a synchronous SRAM that has a shorter timing cycle than prior art approaches.

SUMMARY OF THE INVENTION

It is an object of the present invention to provide a self-timed synchronous SRAM having a shorter overall memory cycle.

According to the present invention, a timing control circuit for a synchronous static random access memory (SRAM) is provided. During a read or write sequence, the timing control circuit generates a series of sequential control signals that enable input/output (I/O) paths between the memory array and a number of I/O latches. Each read/write sequence is followed by an equalization sequence in which the I/O paths are precharged and equalized. In the present invention, the equalization sequence is started prior to the completion of the previous read/write sequence, shortening the overall memory cycle.

According to an aspect of the present invention, the I/O paths each include a secondary sense amplifier, and the equalization sequence is initiated prior to data being driven on the outputs of the secondary sense amplifiers.

According to another aspect of the present invention, the equalization sequence is timed off of one of the control signals of the read/write sequence.

According to another aspect of the present invention, the I/O paths each include one or more equalization circuits and one or more sense amplifiers, and the timing and control circuit includes delay circuits to introduce a sufficient delay between enabling the sense amplifiers and disabling the equalization circuits, to ensure that a large enough differential exists on the I/O path to drive the sense amplifiers.

Advantages and other objects of the present invention will become apparent in light of the following description thereof.

DETAILED DESCRIPTION OF THE EMBODIMENTS

Figure 1:
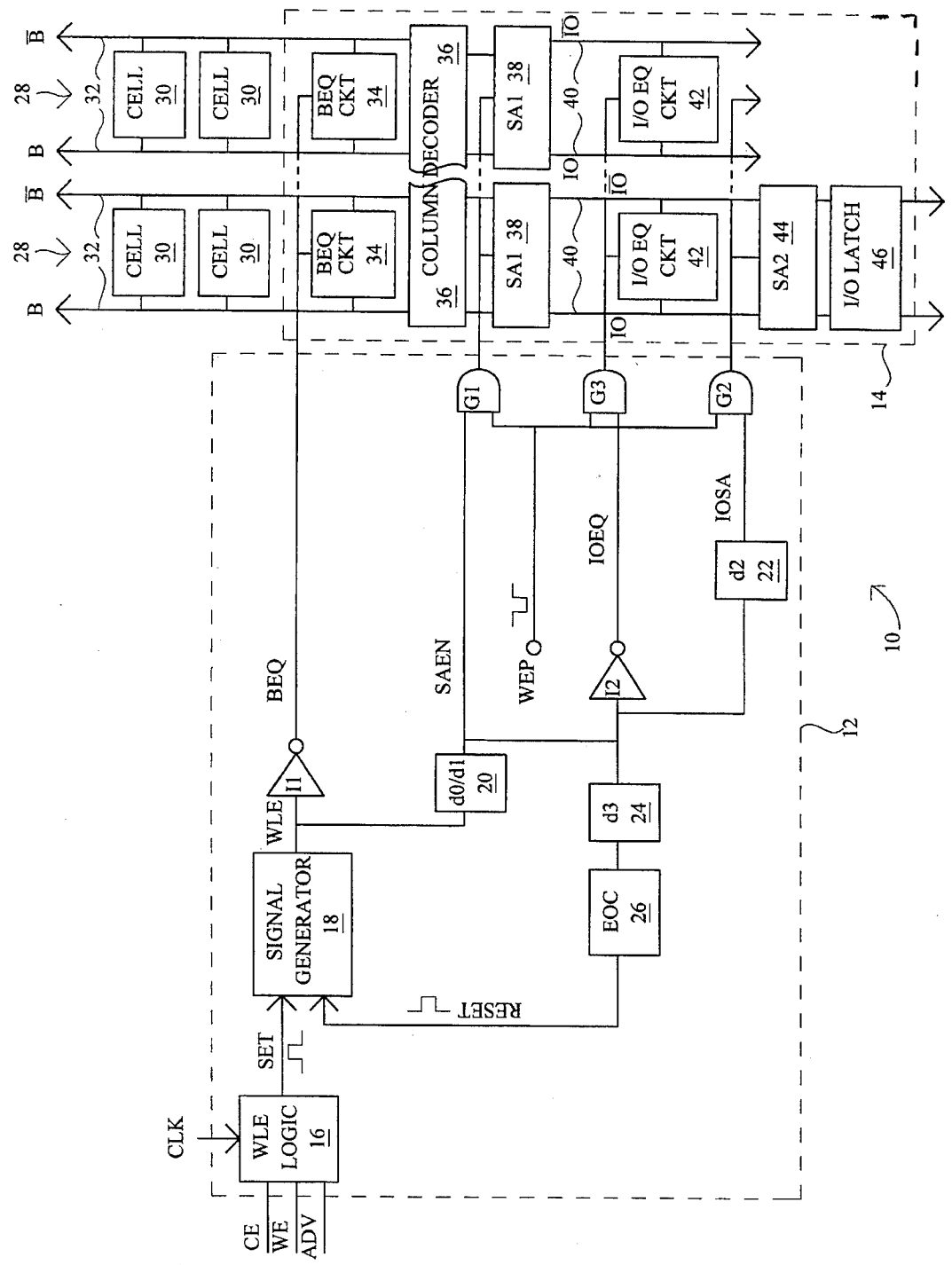
FIG. 1 is a block schematic diagram illustrating a preferred embodiment of the present invention.

FIG. 1 illustrates, generally, a block schematic diagram of a timing control circuit for a synchronous SRAM according to a preferred embodiment of the present invention. The timing control circuit is designated by the general reference character 10, and includes a timing circuit 12 and an input/output (I/O) path circuit 14. The timing circuit 12 includes a word line enable (WLE) logic circuit 16, a signal generator circuit 18, a first delay circuit 20, a second delay circuit 22, a third delay circuit 24, and an end-of-cycle (EOC) circuit 26.

The I/O path circuit 14 is coupled to a number of memory array columns 28, each having memory cells 30 which are coupled to a pair of bit lines 32 by word lines (not shown). Each pair of bit lines 32, in turn, is coupled to a bit line equalization circuit 34 and a column decoder circuit 36. The column decoder circuit 36 couples selected bit line pairs 32 to sense amplifiers 38 (SA1) which are each coupled to a pair of I/O lines 40. The I/O line pairs 40 are each coupled to an I/O line equalization circuit 42 and a secondary sense amplifier 44 (SA2). (Only one secondary sense amplifier is shown in FIG. 1.) The output of each secondary sense amplifier 44 is coupled to an I/O latch 46. It is understood that the bit line equalization circuits 34, the sense amplifiers 38, the I/O line equalization circuits 42, and the secondary sense amplifiers 44 include decoupling circuits that enable them to be coupled and decoupled from their respective bit line or I/O line pair (32 or 40) according to a control signal.

The timing circuit 12 generates a series of control signals to activate various circuits within the I/O path circuit 14. In the preferred embodiment, the operation of the timing circuit 12 can be conceptualized as creating a memory timing cycle having a read/write operation, wherein data are read from or written to the memory cells 30, and a reset operation, wherein the bit line pairs 32 and I/O lines pairs 40 are equalized.

During the read/write operation, in a sequential manner, control signals provided by the timing circuit 12 decouple the bit line equalization circuits 34 from the bit line pairs 32, activate the sense amplifiers 38, decouple the I/O line equalization circuits 42 from the I/O line pairs 40, and then activate the secondary sense amplifiers 44. This provides a data path along the I/O circuit 14 from the memory columns 28 to the I/O latches 46. During the reset operation, control signals provided by the timing circuit 12 sequentially couple the bit line equalization circuits 34 to the bit line pairs 32, deactivate the sense amplifiers 38, couple the I/O line equalization circuits 42 to the I/O line pairs 40, and deactivate the secondary sense amplifiers 44. In the present invention, the timing circuit 12 begins the reset operation before the read/write operation is complete. In this manner the overall memory timing cycle is reduced, allowing for faster overall operating speed in the SRAM.

The operation of the various portions of the preferred embodiment is understood with reference to FIG. 1. The WLE logic circuit 16 receives a number of WLE logic input signals (shown as CE, WE, and ADV) and a clock signal (shown as CLK), to generate a SET pulse therefrom. The WLE logic signals are representative of signals applied to the SRAM from an external host or memory controller unit, and indicate that a read or a write operation is to take place. In the preferred embodiment, if any of the WLE logic signals are high on the first CLK edge, the WLE logic circuit generates a high-going SET pulse, which initiates the timing for a read/write operation.

The signal generator circuit 18 includes two inputs, one for receiving a SET signal, and one for receiving a RESET signal. In response to these two inputs, the signal generator circuit 18 provides a WLE signal output that is used to trigger the various circuits within the I/O path circuit 14. Upon receiving the SET signal, the signal generator circuit 18 output is driven from a first logic level to a second logic level to begin a read/write operation. Upon receiving the RESET signal, the output is driven back to the first logic level. In a preferred embodiment, the SET signal is the SET pulse output from the WLE logic circuit 16 and the RESET signal is a RESET pulse received from the EOC circuit 26. The generation of the RESET pulse will be discussed in more detail at a later point herein.

Figure 2:
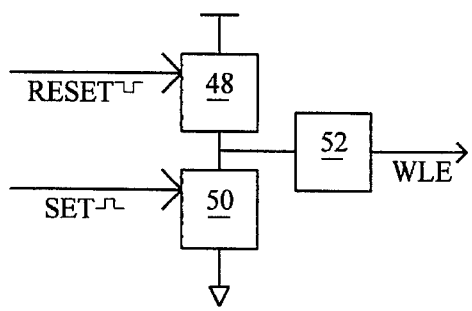
FIG. 2 is a block schematic diagram illustrating a signal generator circuit of a preferred embodiment of the present invention.

The signal generator circuit 18 of a preferred embodiment is set forth in FIG. 2, and is shown to be a set-reset (S-R) flip-flop circuit that includes a pull-up circuit 48, a pull-down circuit 50, and an inverting latch 52. The pull-down circuit 50 is situated between the input of the inverting latch 52 and a negative power supply (ground). The pull-up circuit 48 is situated between the input of the inverting latch 52 and a positive power supply. The pull-down circuit 50 receives the SET pulse, and in response, pulls the input of the inverting latch 52 to ground, providing a high-going edge at the output of the inverting latch 52. This high-going edge can be considered a "SET edge" of the WLE signal, as it is this edge that begins the timing cycle by starting the read/write operation. Conversely, upon receiving the RESET pulse, the pull-up circuit 48 pulls the input of the inverting latch 52 back to the positive power supply, creating a low-going RESET edge at the output of the inverting latch 52. The RESET edge initiates the reset operation. One skilled the art would recognize that other signal generator configurations may be arrived at, and the one set forth herein should not be construed as limiting the present invention thereto.

Figure 3:
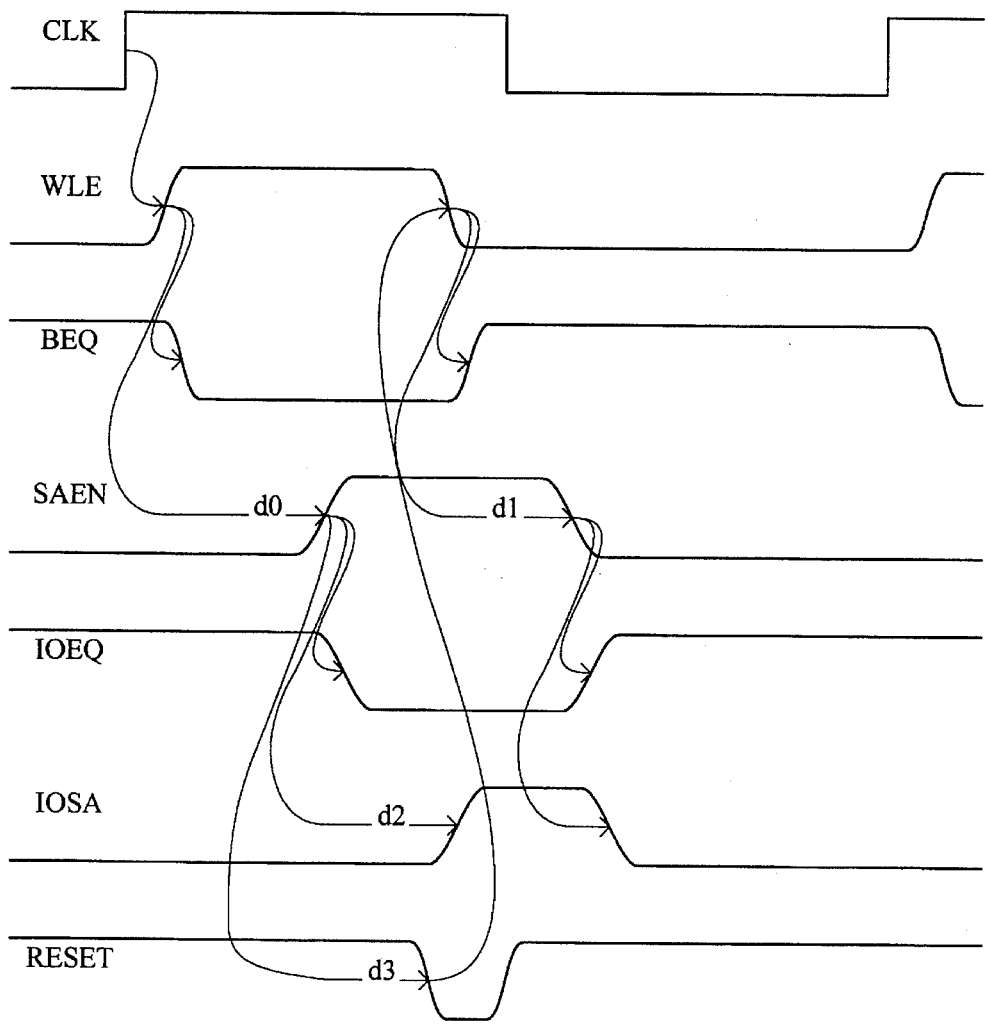
FIG. 3 is a timing diagram illustrating the timing signals of a preferred embodiment of the present invention.

Referring now to FIG. 1 in conjunction with the timing diagram of FIG. 3, the WLE signal is shown to be inverted by inverter I1 to provide a bit line equalization signal (BEQ). Because BEQ follows directly from WLE, BEQ includes a low-going BEQ SET edge, and a high-going BEQ RESET edge. In the embodiment set forth in FIG. 1, the bit line equalization circuits 34 are enabled on a high-going edge, and decoupled from the bit line pairs 32 on a low-going edge. Accordingly, as shown in FIG. 3, when WLE goes high (starting a read or write operation), BEQ goes low, decoupling the bit line equalization circuits 34 from their respective bit line pairs 32.

According to well understood decoding schemes, selected bit line pairs 32 are coupled to sense amplifiers 38 according to a decoded column address by the column decoder circuit 36. Because the particular operation of the column decoder circuit 36 is not essential to the present invention, the column decoder circuit 36 will not be discussed in any further detail herein.

Referring back to FIG. 1, it is shown that the WLE signal is provided to the first delay circuit 20 to generate a sense amplifier enable signal (SAEN). In a preferred embodiment, the first delay circuit 20 delays both the WLE rising edge and the WLE falling edge. As shown in FIG. 3, this creates a high-going SAEN SET edge that is delayed by a time d0 with respect the WLE SET edge, and low-going SAEN RESET edge that is delayed by d1 with respect to the WLE RESET edge. The delay d0 introduced by the first delay circuit 20 is provided to allow sufficient time for the sense amplifier 38 inputs to develop enough of a differential to ensure that the sense amplifier latch will flip correctly when enabled by the SAEN signal. This is also often referred to as allowing the bit lines to "split." It is noted that in a preferred embodiment, the delay (d1) on the falling edge of the SAEN signal is approximately equal to d0. The factors taken into consideration in setting the delay d1 will be discussed at a later point herein. In the embodiment of FIG. 1, the sense amplifiers 38 are enabled by a high-going SAEN signal and disabled by a low-going SAEN signal. In this manner, during a read operation, once WLE is high for a time d0, the sense amplifiers 38 are enabled and the signal provided by the memory cell 30 on those memory columns 28 selected by the column decoder circuit 36 is amplified. In the preferred embodiment, the delay circuit 20 is intended to be adjustable, either via a fuse option, external control signal, bonding option, or a combination thereof. This allows the delays d0 and d1 to be adjusted to compensate for variations in the fabrication process that can impact the operating speed of the active devices that make up the SRAM.

The SAEN signal is inverted by inverter I2 to generate an I/O line equalization signal (IOEQ). IOEQ thus has a low-going IOEQ SET edge and a high-going IOEQ RESET edge that follow from the SAEN SET and RESET edges, respectively. In a similar fashion to the BEQ signal, the I/O line equalization circuits 42 are decoupled from the I/O line pairs 40 on the IOEQ SET edge, and enabled on the IOEQ RESET edge.

The SAEN signal is also applied to the second delay circuit 22 to generate a secondary sense amplifier enable signal (IOSA). In a preferred embodiment, the second delay circuit 22 functions to delay the IOSA SET edge, but not the IOSA RESET edge. The resulting IOSA signal is set forth in FIG. 3, and is shown to include a high-going IOSA SET edge that is delayed by a time d2 with respect to the SAEN SET edge, and a low-going IOSA RESET edge, that follows the SAEN RESET edge. The secondary sense amplifiers 44 are enabled by the IOSA SET edge and disabled by the IOSA RESET edge. The delay, d2, is introduced to allow the I/O line equalization circuits 42 sufficient time to decouple from their respective I/O line pairs 40 and to allow the I/O line pairs 40 to develop a differential before the secondary sense amplifiers 44 are activated (allow the I/O line pairs 40 to "split"). Accordingly, during a read operation, once the I/O line equalization circuits 42 are decoupled from their I/O line pairs 40, the output of the selected sense amplifiers 38 are further amplified by the secondary sense amplifiers 44. In a preferred embodiment, the second delay circuit 22 is a two-input NAND gate having a delay element situated at one input. This implements the "one-sided" delay. In addition, the delay element is intended to be adjustable in the same manners as the first delay circuit 20.

In summary, in the manner described above, the read/write operation is realized by the sequential generation of the BEQ, SAEN, IOEQ and IOSA SET edges. It is understood that in a read operation SAEN and IOSA are high. In a write operation, however, SAEN and IOSA are disabled by a low-going write enable pulse signal (WEP) by the operation of gates G1–G3. The particular write enable logic set forth should not be construed as limiting.

Unlike the self-timed SRAM timing circuits of prior art approaches, the reset operation of the present invention is not initiated by detecting a logic transition on the output of the secondary sense amplifiers, or by some other signal that might indicate the completion of the read or write operation. Instead, the reset operation is started while the read or write operation is still in progress. The reset operation essentially "overlaps" the read or write operation in the time domain, allowing for a shorter overall memory cycle.

Referring once again to FIG. 1, it is shown that while SAEN is applied to inverter I2 to generate the IOEQ signal, SAEN is also applied to the third delay circuit 24. The third delay circuit 24 delays the SAEN SET edge by an amount d3, and provides the delayed signal as an input to the EOC circuit 26. The delay d3 is typically much smaller than the delays d1 or d2. The EOC circuit 26 generates a RESET signal from the delayed SAEN SET edge. Referring once again to FIG. 3, it is shown that in the embodiment of FIG. 1, the RESET signal is a low-going pulse, the leading (falling) edge of which generates the low-going WLE RESET edge. The WLE RESET edge initiates the reset operation.

As will be recalled, in a preferred embodiment, the RESET pulse enables the pull-up circuit 48 in the signal generator 18 which provides a low output via the inverting latch 52. To generate this low-going RESET pulse, the third delay circuit 24 includes a series of inverters, and the EOC circuit 26 includes a two-input XOR gate and a two-input NAND gate. The XOR gate has one input tied to the positive power supply with the other receiving the SAEN signal delayed by d3. The output of the XOR gate is applied to both inputs of the NAND gate, with a delay element being situated at one input. The resulting RESET pulse is thus a low-going pulse. In addition, like other delay circuits (20 and 22) in the preferred embodiment, the third delay circuit 24 includes adjustable elements. Pulse generating circuits are well known in the art, and so the particular XOR-NAND gate combination should not be construed as limiting with regard to the present invention.

The WLE RESET edge provided at the output of the signal generator 18 in response to the RESET pulse results in a high-going BEQ edge, via inverter I1. This enables the bit line equalization circuits 34, which precharge and equalize the bit line pairs 32.

Referring once again to FIGS. 1 and 3, the first delay circuit 20 generates a falling SAEN RESET edge that follows the WLE RESET edge by a delay of d1. The SAEN RESET edge generates a rising IOEQ RESET edge via inverter I2. The delay d1 provides a delay that ensures that the secondary sense amplifiers 44 have been on long enough to allow correct data to be latched in the I/O latches 46. Accordingly, following the delay d1, the sense amplifiers 38 are disabled by the SAEN RESET edge, and the I/O equalization circuits 42 are enabled by the following IOEQ RESET edge.

To end the reset operation (and the memory cycle) a falling IOSA RESET edge directly follows from the falling SAEN RESET edge, disabling the secondary sense amplifiers 44. It is noted that the SRAM is ready for the next memory cycle to begin (on the next rising clock edge) as soon as data are latched by the I/O latches 46 and the bit line pairs 32 are sufficiently equalized.

It is understood that the delay d3 introduced by the third delay circuit 24 is sufficient to, along with delay d1, provide a minimum sense time for the secondary sense amplifiers 44. One skilled in the art would recognize that this minimum sense time includes sufficient time for the I/O latches 46 to latch the outputs provided by the secondary sense amplifiers 44.

The invention has been described in connection with its preferred embodiments, and may be changed, and other embodiments derived, without departing from the spirit and scope of the invention. Accordingly, the invention is intended to be limited only by the appended claims.

What we claim is:

1. In a semiconductor static random access memory device having at least one memory array, the array including a plurality of memory cells arranged in columns, each column including a bit line pair, a timing control circuit, comprising:

a timing circuit for providing a timing signal that transitions from a first logic state to a second logic state to generate a timing signal set edge, the timing signal returning to the first logic state to generate a timing signal reset edge in response to an end-of-cycle signal;

a first delay circuit responsive to the timing signal for generating a first control signal, said first delay circuit delaying the timing signal set edge to generate a first control signal set edge and delaying the timing signal reset edge to generate a first control signal reset edge;

a second delay circuit responsive to the first control signal for generating a second control signal, said second delay circuit delaying the timing signal set edge to generate a second control signal set edge, a second control signal reset edge substantially following the first control signal reset edge;

a third delay circuit responsive to the timing signal for generating a third control signal, the third control signal having a third control signal set edge that is delayed with respect to the timing signal set edge; and an end-of-cycle circuit responsive to the third control signal set edge for generating the end-of-cycle signal.

2. The timing control circuit of claim 1 wherein:

said timing circuit includes
- two inputs for receiving the end-of-cycle signal and a start-cycle signal,
- a pull-up circuit coupled between an output node and a positive power supply, said pull-up circuit responsive to one of the inputs,
- a pull-down circuit coupled between the output node and a negative power supply, said pull-down circuit responsive to the other input, and
- a latch coupled to the output node.

3. The timing control circuit of claim 1 wherein:

the third edge delay circuit is intermediate the first edge delay circuit and the end-of-cycle circuit and delays the first control signal set edge to generate the third control signal set edge.

4. The timing and control circuit of claim 1 including:

a plurality of sense amplifiers coupled to the bit lines for sensing data on the bit lines in response to the first control signal set edge, said sense amplifiers being disabled in response to the first control signal reset edge;

a plurality of I/O lines, each I/O line receiving the sensed voltage output from a selected one of said sense amplifiers; and a plurality of secondary sense amplifiers coupled to the I/O lines for amplifying the voltage on the I/O lines in response to the second control signal set edge, said secondary sense amplifiers being disabled from the I/O lines in response to the second control signal reset edge.

5. The timing control circuit of claim 4 wherein:

the delay of said third delay circuit generates the third control signal set edge prior to the secondary sense amplifiers amplifying data on said I/O lines.

6. The timing control circuit of claim 4 wherein:

the delay of said third delay circuit generates the third control signal set edge prior to the second control signal set edge.

7. The timing control circuit of claim 1 including:

a plurality of bit line equalization circuits coupled to the bit lines for equalizing the voltage on the bit lines in response to the timing signal reset edge, said bit line equalization circuits being disabled in response to the timing signal set edge.

8. The timing control circuit of claim 7 wherein:

each said bit line pair has a minimum split time for developing a voltage differential from a selected memory cell; and the delay between the timing signal and first control signal set edges is at least as long as the minimum bit line split time.

9. The timing control circuit of claim 1 including:

a plurality of I/O line equalization circuits each coupled to a pair of I/O lines for equalizing the voltage on the I/O line pairs in response to the first control signal reset edge, said I/O line equalization circuits being disabled in response to the first control signal set edge.

10. The timing control circuit of claim 9 wherein:

each said I/O line pair has a minimum I/O split time for developing a voltage differential from the output of one of the sense amplifiers; and the delay between the first and second control signal set edges is at least as long as the minimum I/O split time.

11. In a semiconductor memory device having a bit line equalization circuit and a sense amplifier coupled to a bit line pair, an I/O line pair coupled to the output of the sense amplifier, an I/O line equalization circuit coupled to the I/O line pair, and a secondary sense amplifier coupled to the I/O line pair for amplifying a voltage differential on the I/O line pair when enabled, a timing circuit, comprising:

read/write timing means for, in a sequential order, disabling the bit line equalization circuit, enabling the sense amplifier, disabling the I/O equalization circuit, and enabling the secondary sense amplifier to complete a read/write operation; and reset timing means for, in a sequential order, enabling the bit line equalization circuit, disabling the sense amplifier, enabling the I/O equalization circuit, and disabling the secondary sense amplifier to complete a reset operation, said reset timing means being activated during the read/write operation of said read/write timing means.

12. The timing circuit of claim 11 wherein:

said reset timing means begins enabling the bit line equalization circuit prior to the secondary sense amplifier being enabled by said read/write timing means.

13. The timing circuit of claim 12 wherein:

the secondary sense amplifier drives a latch data line pair; and said reset timing means begins a reset operation prior to the latch data line pair being driven by the secondary sense amplifier.

14. The timing circuit of claim 11 wherein:

said read/write timing means delays enabling the sense amplifiers after disabling the bit line equalization circuits.

15. The timing circuit of claim 14 wherein:

the read/write timing means delay between enabling the sense amplifiers and disabling the bit line equalization circuits is at least as great as a minimum bit line split time.

16. The timing circuit of claim 11 wherein:

said read/write timing means delays enabling the secondary sense amplifier after disabling the I/O equalization circuit.

17. The timing circuit of claim 16 wherein:

the read/write timing means delay between enabling the sense amplifiers and disabling the bit line equalization circuits is at least as great as a minimum I/O line split time.

18. The timing circuit of claim 11 wherein:

said reset timing means delays enabling the I/O equalization circuits after said read/write timing means disables the I/O equalization circuit.

19. The timing circuit of claim 18 wherein:

the delay between said read/write timing means disabling the I/O equalization circuit and said reset timing means enabling the I/O equalization circuit is at least as great as a minimum I/O line split time.

20. The timing circuit of claim 11 wherein:

said reset timing means delays disabling the secondary sense amplifier after said read/write timing means enables the secondary sense amplifier, the delay being at least as long as a minimum secondary sense amplifier sense time.

* * * * *